US012347814B2

(12) United States Patent
Nakata et al.

(10) Patent No.: US 12,347,814 B2
(45) Date of Patent: Jul. 1, 2025

(54) SEMICONDUCTOR PACKAGE AND SEMICONDUCTOR DEVICE

(71) Applicant: Mitsubishi Electric Corporation, Tokyo (JP)

(72) Inventors: Yosuke Nakata, Tokyo (JP); Jun Fujita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 18/508,321

(22) Filed: Nov. 14, 2023

(65) Prior Publication Data

US 2024/0079384 A1  Mar. 7, 2024

Related U.S. Application Data

(63) Continuation of application No. 17/281,202, filed as application No. PCT/JP2018/043391 on Nov. 26, 2018, now Pat. No. 11,901,341.

(51) Int. Cl.
*H01L 25/07* (2006.01)
*H01L 23/00* (2006.01)
(Continued)

(52) U.S. Cl.
CPC .......... *H01L 25/072* (2013.01); *H01L 23/142* (2013.01); *H01L 23/3157* (2013.01);
(Continued)

(58) Field of Classification Search
CPC .............. H01L 23/142; H01L 23/4924; H01L 23/3157; H01L 24/32; H01L 24/48;
(Continued)

(56) References Cited

U.S. PATENT DOCUMENTS 10,014,275 B2   7/2018 Heinrich et al.
11,901,341 B2 * 2/2024 Nakata .................. H01L 25/072
(Continued)

FOREIGN PATENT DOCUMENTS

DE    102016104844 A1    9/2017
DE    112014007285 T5    10/2017
(Continued)

OTHER PUBLICATIONS

International Search Report issued in PCT/JP2018/043391; mailed Jan. 29, 2019.
(Continued)

*Primary Examiner* — Jasmine J Clark
(74) *Attorney, Agent, or Firm* — Studebaker Brackett PLLC

(57) ABSTRACT

An object is to provide technology that enables cost reduction or downsizing of semiconductor packages. The wiring element includes a second substrate, a plurality of first relay pads arranged on a surface of the second substrate opposite to the conductor substrate and connected to each of the control pads of the plurality of semiconductor elements by wires, a plurality of second relay pads arranged on the surface of the second substrate opposite to the conductor substrate, the number thereof being equal to or lower than the number of the plurality of first relay pads, and a plurality of wiring portions arranged on the surface of the second substrate opposite to the conductor substrate and selectively connecting the plurality of first relay pads and the plurality of second relay pads.

28 Claims, 9 Drawing Sheets

(51) Int. Cl.
  *H01L 23/14*   (2006.01)
  *H01L 23/31*   (2006.01)
  *H01L 23/492*  (2006.01)

(52) U.S. Cl.
  CPC .......... *H01L 23/4924* (2013.01); *H01L 24/32* (2013.01); *H01L 24/48* (2013.01); *H01L 24/73* (2013.01); *H01L 24/83* (2013.01); *H01L 2224/29139* (2013.01); *H01L 2224/29147* (2013.01); *H01L 2224/32245* (2013.01); *H01L 2224/48157* (2013.01); *H01L 2224/49171* (2013.01); *H01L 2224/73267* (2013.01); *H01L 2224/8384* (2013.01)

(58) Field of Classification Search
  CPC ...................... H01L 24/73; H01L 24/83; H01L 2224/29139; H01L 2224/29147; H01L 2224/32245; H01L 2224/48157; H01L 2224/49171; H01L 2224/73267; H01L 2224/8384; H01L 25/072
  USPC ................................................ 257/666, 678
  See application file for complete search history.

(56) References Cited

U.S. PATENT DOCUMENTS

| | | |
|---|---|---|
| 2015/0028462 A1 | 1/2015 | Hasegawa et al. |
| 2015/0287665 A1 | 10/2015 | Hanada |
| 2016/0141284 A1 | 5/2016 | Ishihara et al. |
| 2017/0271298 A1 | 9/2017 | Heinrich et al. |
| 2017/0278770 A1 | 9/2017 | Kato et al. |
| 2021/0167005 A1 | 6/2021 | Nakata |

FOREIGN PATENT DOCUMENTS

| | | |
|---|---|---|
| JP | 2014-199955 A | 10/2014 |
| WO | 2014046058 A1 | 3/2014 |

OTHER PUBLICATIONS

Office Action issued in DE 11 2018 008 167.2; mailed by the German Patent and Trademark Office on Oct. 15, 2024.

\* cited by examiner

SEMICONDUCTOR PACKAGE AND SEMICONDUCTOR DEVICE

CROSS-REFERENCE TO RELATED APPLICATIONS

This application is a Continuation of U.S. patent application Ser. No. 17/281,202 filed Mar. 29, 2021, now U.S. Pat. No. 11,901,341, which is the U.S. National Stage of International Application No. PCT/JP2018/043391 filed Nov. 26, 2018, the entire contents of which are incorporated herein by reference.

TECHNICAL FIELD

The present invention relates to a semiconductor package and a production method thereof, and a semiconductor device.

BACKGROUND ART

Various techniques have been proposed for power semiconductor devices. For example, Patent Document 1 proposes a semiconductor device that extracts power controlled by a semiconductor element from a post electrode by sealing the semiconductor element and the post electrode connected to the semiconductor element with a resin.

Meanwhile, in a power semiconductor device such as a Metal Oxide Semiconductor Field Effect Transistor (MOSFET) module using silicon carbide (SiC), the technique of Patent Document 1 cannot be applied thereto as it is, due to the difficulty in enlargement of the area of, moreover, in an increase in the current capacity of the MOSFET. Therefore, a configuration has been proposed in which a plurality of semiconductor chips are connected in parallel so as to cope with an increase in the current capacity. For example, Patent Document 2 proposes a configuration in which signals are input to a signal wiring pattern on an insulating substrate from a plurality of semiconductor chips via wires.

PRIOR ART DOCUMENTS

Patent Documents

[Patent Document 1] Japanese Patent Application Laid-Open No. 2014-199955
[Patent Document 2] International Publication No. 2014/046058

SUMMARY

Problem to be Solved by the Invention

However, in the technique of Patent Document 2, the signal wiring pattern corresponding to the gate electrode and a main current circuit pattern corresponding to the source electrode are arranged on the same member. Accordingly, in order to flow a relatively large current through the main current circuit pattern, for example, the signal wiring pattern and the main current circuit pattern are needed to be sufficiently spaced to secure insulation therebetween. Consequently, there has been a problem including the larger size of the semiconductor device and the cost increase due to the complicated assembly method.

The present invention has been made in view of the above problem and has an object to provide a technique capable of reducing the cost of a semiconductor package or downsizing the same.

Means to Solve the Problem

According to the present invention, a semiconductor package includes a conductor substrate, a plurality of semiconductor elements having a switching function and bonded to a first main surface of the conductor substrate, and a wiring element bonded to the first main surface of the conductor substrate, in which each of the plurality of semiconductor elements includes a first substrate, a first main electrode arranged on a surface of the first substrate opposite to the conductor substrate, a second main electrode arranged on a surface of the first substrate on a conductor substrate side and bonded to the conductor substrate, and a control pad configured to control a current flowing between the first main electrode and the second main electrode, the wiring element includes a second substrate, a plurality of first relay pads arranged on a surface of the second substrate opposite to the conductor substrate and connected to each of the control pads of the plurality of semiconductor elements by wires, a plurality of second relay pads arranged on the surface of the second substrate opposite to the conductor substrate, the number of the second relay pads being equal to or lower than the number of the plurality of first relay pads, and a plurality of wiring portions arranged on the surface of the second substrate opposite to the conductor substrate and selectively connecting the plurality of first relay pads and the plurality of second relay pads. The semiconductor package further includes a plurality of first conductor members bonded to the first main electrodes of the plurality of semiconductor elements, a plurality of second conductor members bonded to the plurality of second relay pads of the wiring element, and a sealing material covering the plurality of semiconductor elements, the wiring element, at least a part the plurality of first conductor members, at least a part of the plurality of second conductor members, and the first main surface of the conductor substrate, with an exposed surface being a surface of the plurality of first conductor members on the opposite side of the conductor substrate exposed, with an exposed surface being a surface of the plurality of second conductor members on the opposite side of the conductor substrate exposed, and with a second main surface of the conductor substrate on an opposite side of the first main surface exposed.

Effects of the Invention

According to the present invention, the wiring element includes second substrate, a plurality of first relay pads connected to each of the control pads of the plurality of semiconductor elements by wires, a plurality of second relay pads the number of which is equal to or lower than the number of the plurality of first relay pads, and a plurality of wiring portions selectively connecting the plurality of first relay pads and the plurality of second relay pads. Consequently, the cost reduction or downsizing of the semiconductor packages is ensured.

The explicit purpose, feature, phase, and advantage of the present invention will be described in detail hereunder with attached drawings.

DESCRIPTION OF EMBODIMENTS

Embodiment 1

Figure 1:
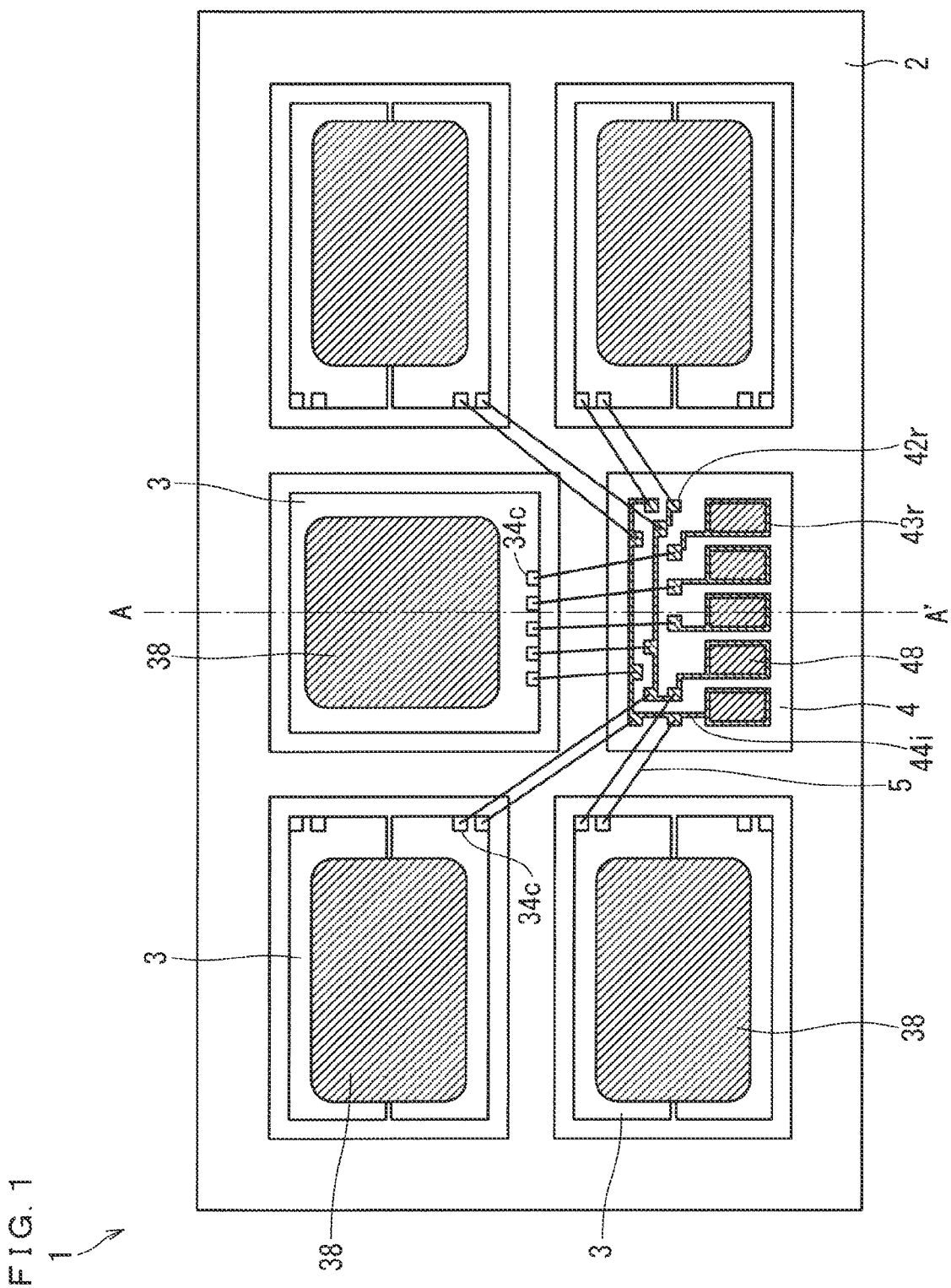
FIG. 1 A schematic plan view illustrating a configuration of a semiconductor package according to Embodiment 1.
Figure 2:
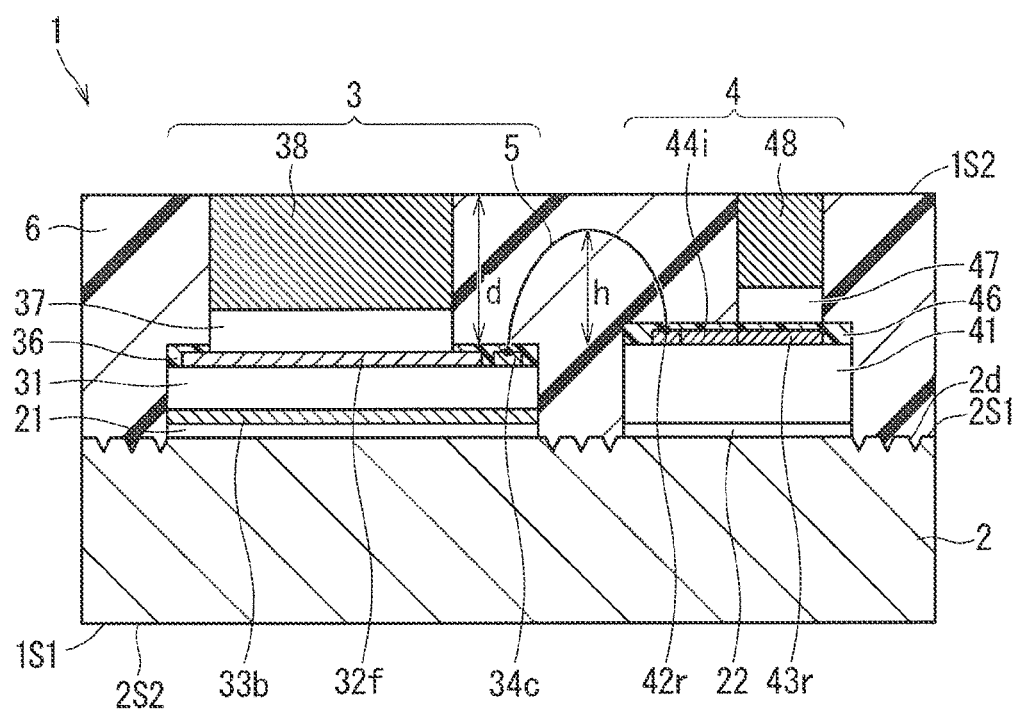
FIG. 2 A schematic cross-sectional view illustrating the configuration of the semiconductor package according to Embodiment 1.

FIG. 1 is a schematic plan view illustrating a configuration of a semiconductor package 1 according to Embodiment 1 of the present invention, and FIG. 2 is a schematic cross-sectional view taken along the line A-A' of FIG. 1, illustrating the configuration of the semiconductor package 1.

As illustrating in FIGS. 1 and 2, the semiconductor package 1 includes a conductor substrate 2, a plurality of semiconductor elements 3, and a wiring element 4. Hereinafter, although the number of a plurality of semiconductor elements 3 will be described as being five, any number of the semiconductor elements 3 as long as the number thereof is two or more may be provided. Also hereinafter, although the number of the wiring elements 4 will be described as being one, any number of the wiring elements 4 as long as the number thereof is less than the number of a plurality of semiconductor elements 3 may be provided.

A plurality of semiconductor elements 3 are bonded to a first main surface 2S1 (FIG. 2) of the conductor substrate 2, and each of a plurality of semiconductor elements 3 has a switching function. The wiring element 4 is bonded to the first main surface 2S1 of the conductor substrate 2. In the example of FIG. 1, in a plan view, the wiring element 4 is closely placed with a plurality of semiconductor elements 3 in a state where a plurality of semiconductor elements 3 surround the three directions (upward, leftward, and rightward) excluding one direction (downward) of the wiring element 4.

Each of a plurality of semiconductor elements 3 includes a semiconductor substrate 31 being a first substrate, a front surface electrode 32f being a first main electrode, a rear surface electrode 33b being a second main electrode, and one or more of control pads 34c. In addition, at least one of a plurality of semiconductor elements 3 may further include at least one of a current sense element and a temperature sense element (not illustrated).

The front surface electrode 32f is arranged on the front surface being the surface of the semiconductor substrate 31 opposite to the conductor substrate 2. The front surface electrode 32f contains, for example, nickel as a main material and gold or silver on the outermost surface of the material. The front surface electrode 32f corresponds to a source electrode.

The rear surface electrode 33b is arranged on the rear surface being the surface of the semiconductor substrate 31 on the conductor substrate side and bonded to the conductor substrate 2. With this arrangement, the potentials of the rear electrodes 33b of a plurality of semiconductor elements 3 are equal to each other. The rear surface electrode 33b contains, for example, nickel as a main material and gold or silver on the outermost surface of the material. The rear surface electrode 33b corresponds to a drain electrode.

The control pad 34c is a pad for controlling the current flowing between the front surface electrode 32f and the rear surface electrode 33b. The control pad 34c corresponds to a gate electrode.

The wiring element 4 includes a wiring substrate 41 being a second substrate, a plurality of first relay pads 42r being a plurality of first connection portions, a plurality of second relay pads 43r being a plurality of second connection portions, and a plurality of internal wiring portions 44i being a plurality of wiring portions.

A plurality of first relay pads 42r, a plurality of second relay pads 43r, and the internal wiring portions 44i are arranged on the front surface being the surface of the wiring substrate 41 opposite to the conductor substrate 2, and are insulated from the conductor substrate 2 by the wiring substrate 41 or the like.

A plurality of first relay pads 42r are connected to the control pads 34c of a plurality of semiconductor elements 3 by wires 5. The wire 5 has a wire diameter of, for example, 100 μmΦ or less, and contains gold as a main material.

The number of a plurality of second relay pads 43r is less than or equal to the number of a plurality of first relay pads 42r. In the example of FIG. 1, although a plurality of second relay pads 43r are arranged along the edge of the wiring substrate 41 close to the outside of the semiconductor package 1, the positions of a plurality of second relay pads 43r are not limited thereto.

A plurality of internal wiring portions 44i selectively connect to a plurality of first relay pads 42r and a plurality of second relay pads 43r inside the wiring element 4. In the example of FIG. 1, the width of the first relay pad 42r is larger than the width of the internal wiring portion 44i, and the width of the second relay pad 43r is larger than the width of the first relay pad 42r.

As illustrated in FIGS. 1 and 2, the semiconductor package 1 further includes a plurality of conductor plates 38 being a plurality of first conductor members, a plurality of conductor pieces 48 being a plurality of second conductor members, and a sealing material 6.

A plurality of conductor plates 38 are bonded to the front surface electrodes 32f of a plurality of semiconductor elements 3, and a plurality of conductor pieces 48 are bonded to a plurality of second relay pads 43r of the wiring element 4. Each of the front surface electrodes 32f and the second relay pads 43r contains a solder-bondable metal, for example, nickel as a main material.

The sealing material 6 covers a plurality of semiconductor elements 3, a wiring element 4, at least a part of a plurality of conductor plates 38, at least a part of a plurality of conductor pieces 48, and a first main surface 2S1 of the conductor substrate 2 and practically seals those items. The sealing material 6 contains an epoxy resin and is formed by, for example, a transfer molding method, a compression molding method, or a potting method.

An exposed surface of each of a plurality of conductor plates 38 being an opposite side surface to the conductor substrate 2, an exposed surface of each of a plurality of conductor pieces 48 being an opposite side surface to the conductor substrate 2, and the first main surface and a second main surface being an opposite side surface thereto of the conductor substrate 2 are exposed from the sealing material 6. As illustrated in FIG. 2, the semiconductor package 1 has a first surface 1S1 and a second surface 1S2 facing each other. The second main surface 2S2 of the conductor substrate 2 corresponds to the first surface 1S1 of the semiconductor package, and the exposed surfaces of a plurality of conductor plates 38 and the exposed surfaces of a plurality of conductor pieces 48 correspond to the second surface 1S2 of the semiconductor package 1.

A configuration in which parts of a plurality of conductor plates 38 and a plurality of conductor pieces 48 are exposed from the sealing material 6 is formed by, for example, a grinding process in which metal parts to be a plurality of conductor plates 38 and a plurality of conductor pieces 48 are covered with a sealing component being the sealing material 6 and then parts of those items are ground to expose the metal parts. At this point, the grinding is finished when the height of the sealing material 6 after grinding is sufficiently higher than a loop height h of a wire 5 and the wire 5 is not exposed from the sealing material 6.

In Embodiment 1, the melting point of a bonding material 21 for bonding a plurality of semiconductor elements 3 and the conductor substrate 2 is higher than the melting point of the solder. The solder bonding step in the manufacturing process of a typical semiconductor device is 450° C. or lower; therefore, the melting point of the bonding material 21 is preferably higher than 450° C.

Here, a plurality of semiconductor elements 3 and the conductor substrate 2 are sinter-bonded (fire-bonded) with, for example, a silver-based material or a copper-based material.

In the configuration in which a silver-based material is used for the bonding material 21, for example, a paste to be the bonding material 21 is formed at a predetermined position on the conductor substrate 2 by printing or dispensing, and then the semiconductor element 3 is placed on the paste, and the semiconductor element 3 and the conductor substrate 2 are closely attached to each other with an utmost reduced amount of bubbles in the paste. Then, the paste is sintered in a nitrogen atmosphere at a temperature of 200° C. to 300° C. for several tens of minutes without pressurization. As described above, in the configuration in which a silver-based material is used for the bonding material 21, the sinter-bonding for bonding a plurality of semiconductor elements 3 and the conductor substrate 2 is performed without pressurization.

In the configuration in which a copper-based material is used for the bonding material 21, for example, a paste to be the bonding material 21 is formed at a predetermined position on the conductor substrate 2 by printing or dispensing, and then the semiconductor element 3 is placed on the paste, and the paste is sintered in a nitrogen atmosphere at a temperature of 200° C. to 300° C. for several tens of minutes while being pressurized at the load of 10 to 40 MPa. At the time of the sintering, for example, a Teflon sheet is used to prevent the surface of the semiconductor element 3 from being scratched by the load. Also when a sheet molded product is used to supply the sintered material, the sintered material is temporarily attached to the rear surface of the semiconductor element 3 in advance, then the semiconductor element 3 is temporarily crimped to a predetermined position on the conductor substrate 2, and the pressure sintering is performed under the same conditions. As described above, in the configuration in which a copper-based material is used for the bonding material 21, the sinter-bonding for bonding a plurality of semiconductor elements 3 and the conductor substrate 2 is performed with pressurization.

A plurality of semiconductor elements 3 and the conductor substrate 2 may be diffusion-bonded instead of being sinter-bonded. Further, although the bonding material 21 for bonding a plurality of semiconductor elements 3 and the conductor substrate 2 has been described above, a bonding material 22 for bonding the wiring element 4 and the conductor substrate 2 may also be the same as the bonding material 21.

The semiconductor package 1 according to Embodiment 1 further includes a protective film 36. The protective film 36 is a film that covers the edge being the end portion of each of a plurality of semiconductor elements 3 and has a Young's modulus lower than that of the sealing material 6. The protective film 36 contains, for example, polyimide. For example, after bonding a plurality of semiconductor elements 3 and the wiring element 4 to the conductor substrate 2, a precursor solution of the protective film 36 is drawn using a dispenser, and the protective film 36 is formed by firing the precursor solution.

For example, the conductor substrate 2 contains copper as a main material. A groove 2d, which is a recess, is arranged in a region other than the region to which a plurality of semiconductor elements 3 and the wiring element 4 are bonded in the first main surface 2S1 of the conductor substrate 2. The recess may be a recessed hole or the like instead of the groove 2d.

A plurality of conductor plates 38 and a plurality of conductor pieces 48 contain, for example, copper as a main material. Further, as illustrated in FIG. 2, a plurality of conductor plates 38 and the front surface electrodes 32f of a plurality of semiconductor elements 3 are bonded by, for example, solder 37, and a plurality of conductor pieces 48 and a plurality of second relay pads 43r of the wiring element 4 are bonded by, for example, solder 47. The thickness of a plurality of conductor plates 38 and a plurality of conductor pieces 48, that is, the thickness d of a plurality of conductor plates 38 and the thickness of a plurality of conductor pieces 48 after the above-mentioned grinding process is sufficiently larger than the loop height h of the wire 5.

Figure 10:
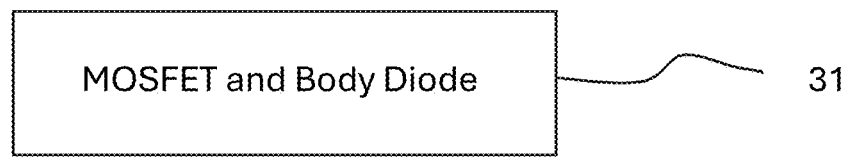
FIG. 10 A representation of a semiconductor substrate including a MOSFET and body diode.

In Embodiment 1, a plurality of semiconductor elements 3 include compound semiconductors. For example, a plurality of conductor elements 3 contain silicon carbide (SiC) as a main material of a compound semiconductor. FIG. 10 shows that each of the semiconductor substrates 31 of the plurality of semiconductor elements 3 can include, for example, a MOSFET that performs a switching operation and a body diode that performs a reflux operation. Then, bidirectional energization between the MOSFET and the body diode is executable.

In Embodiment 1, after a plurality of conductor plates 38 are formed and further, after the semiconductor package 1 is formed, a screening test for detecting defects in a plurality of semiconductor elements 3 is conducted. As a result, deterioration of the characteristics of elements such as electrodes due to the body diode energization in the screening test can be suppressed. In a configuration in which the body diode energization is not used as the main reflux path, the semiconductor element 3 may include, for example, a Schottky Barrier Diode (SBD) for reflux instead of the body diode.

The wiring substrate 41 of the wiring element 4 may be, for example, a silicon substrate containing silicon (Si) as a main material. In this case, for example, an oxide film is formed on the silicon substrate, and a plurality of first relay pads 42r, a plurality of second relay pads 43r, and a plurality of internal wiring portions 44i are formed on the oxide film. These pad and wiring patterns can be formed using common wafer process techniques, such as patterning by photomechanical process after sputtering. These pads and wiring portions are covered with, for example, the coating film 46, which contains polyimide as the protective film 36 does, for example.

The wiring substrate 41 of the wiring element 4 is not limited to the above-mentioned substrate, and may be, for example, a resin substrate containing a resin. In this case, for example, before bonding the wiring substrate 41 to the conductor substrate 2, the first relay pad 42r and the second relay pad 43r are formed with a copper material in advance on the surface of the resin substrate. Then, the conductor piece 48 is bonded to the second relay pad 43r, which is electrically connected to the outside, by sinter-bonding. After that, the wiring substrate 41 is bonded to the conductor substrate 2. On the rear surface of the resin substrate, for example, at least one of a thin film such as copper being a bonding film, a thin film such as nickel, silver, and copper being a connecting film, and a thin film such as gold being an antioxidant film is selectively formed. When a nickel thin film is used for the connecting film, a gold thin film is desirably provided on the outermost surface of the connecting film in order to secure the bondability of the sinter-bonding using silver.

The semiconductor substrate 31 of the semiconductor element 3 is, for example, ground to a thickness of about 100 μm. On the other hand, the wiring element 4 is ground to, for example, the thickness of about 400 μm, about 250 μm, and if necessary, about 150 μm. Even when a silicon substrate is used for the wiring substrate 41 and the wiring element 4 is thinned to about 150 μm, problems in the wafer process are less likely to occur. By providing a height difference between the semiconductor element 3 and the wiring substrate 4 in this manner, the effect of facilitating wire bonding of the wire 5 is generated. In addition, the outer peripheral portion of the semiconductor element 3 has a withstand voltage holding structure such as a guard ring and has a high electric field; therefore, the loop portion of the wire 5 above the outer peripheral portion of the semiconductor element 3 in cross-sectional view is desirably away from the surface of the semiconductor element 3 as far as possible. When the semiconductor element 3 is thinner than the wiring substrate 4, the loop portion of the wire 5 can be kept away from the surface of the semiconductor element 3, so that the semiconductor element 3 is desirably thinner than the wiring element 4.

Figure 3:
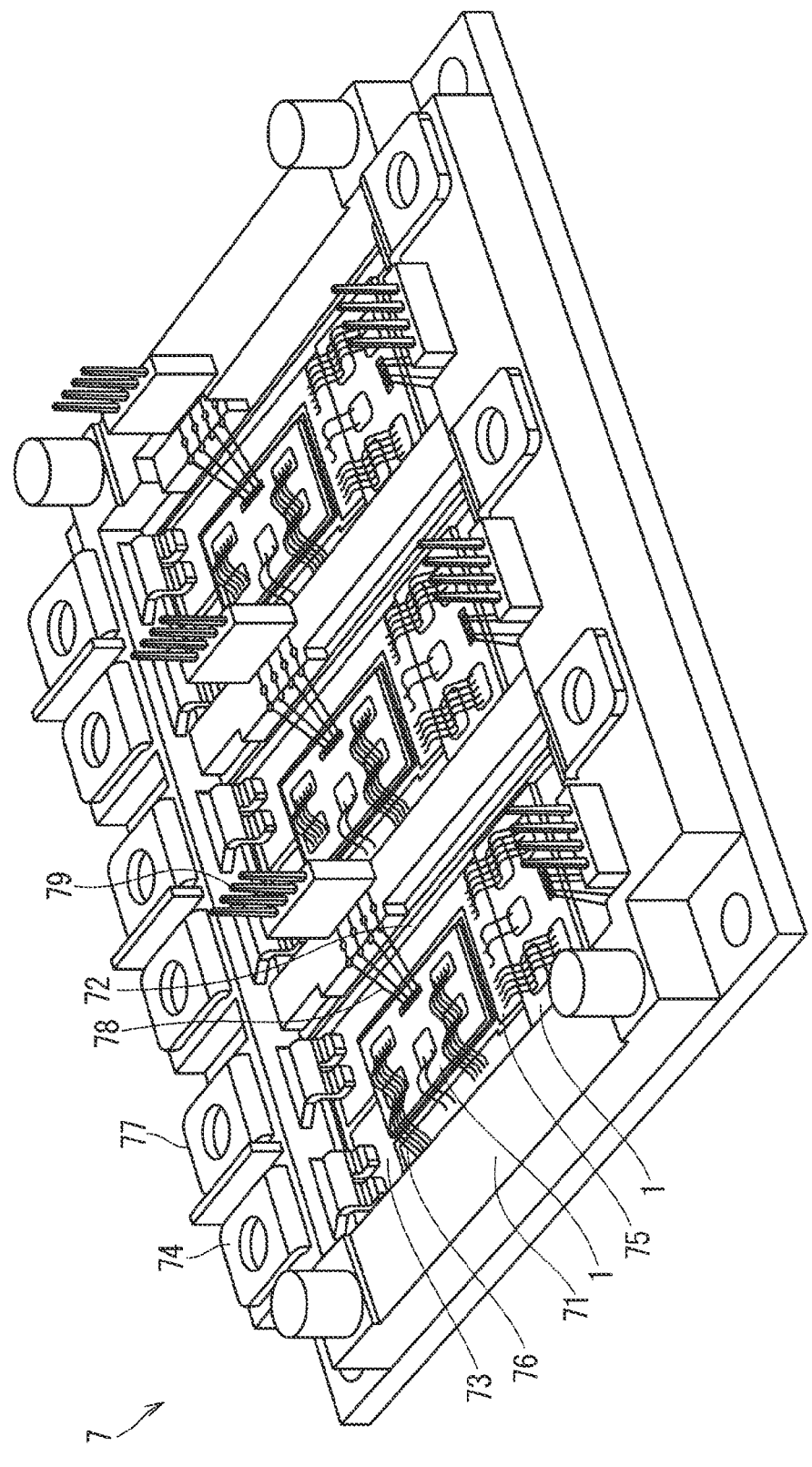
FIG. 3 A schematic perspective view illustrating the configuration of the semiconductor device according to Embodiment 1.
Figure 4:
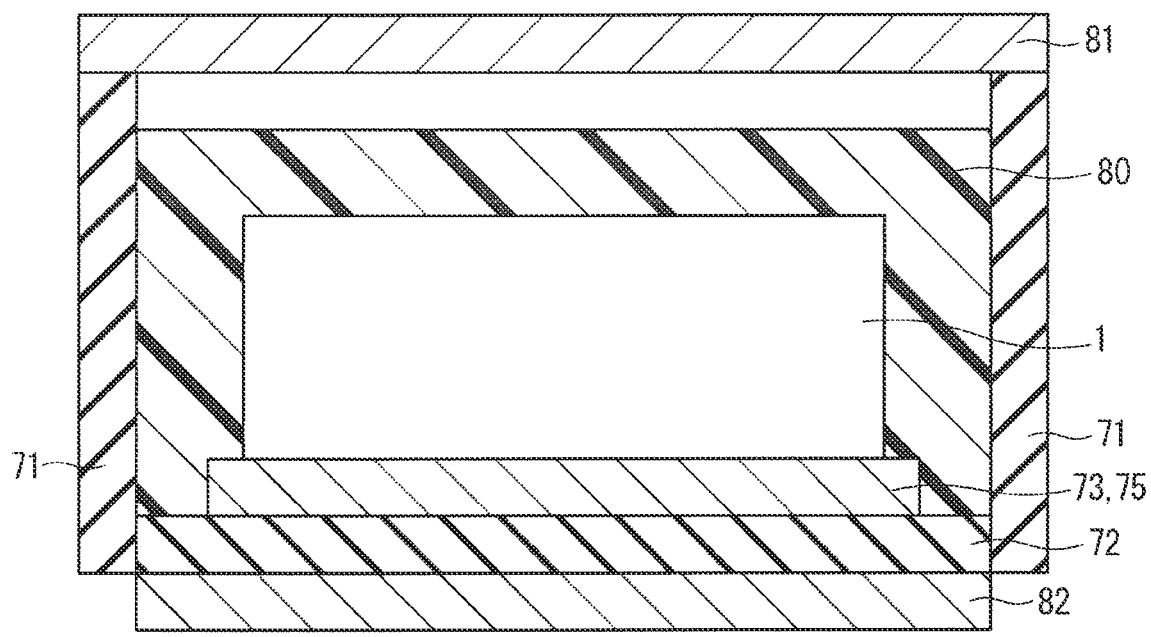
FIG. 4 A schematic cross-sectional view illustrating the configuration of the semiconductor device according to Embodiment 1.

FIG. 3 is a schematic perspective view illustrating the configuration of the semiconductor device 7 using the semiconductor package 1 according to Embodiment 1, and FIG. 4 is a schematic cross-sectional view illustrating a part thereof.

As illustrated in FIGS. 3 and 4, the semiconductor device 7 includes one or more semiconductor packages 1. Further, as illustrated in FIGS. 3 and 4, the semiconductor device 7 further includes the resin case 71, the insulating substrate 72, the first main current circuit pattern 73 being a first circuit pattern, the external electrode 74, and the circuit pattern 75, the wire 76, the external electrode 77 being a main terminal, the wire 78, and the signal terminal 79 being a control terminal. Further, as illustrated in FIG. 4, the semiconductor device 7 further includes the sealing material 80, the lid 81, and the metal layer 82. Note that one or more semiconductor packages 1 may include six semiconductor packages constituting a full bridge circuit as a unit.

The resin case 71 and the insulating substrate 72 form a container body having a space opened upward. The first main current circuit pattern 73 is arranged in the portion of the insulating substrate 72 that forms the space of the container body. Further, the first main current circuit pattern 73 is bonded to the second main surface 2S2 (FIG. 2) of the conductor substrate 2 exposed from the sealing material 6 in the first surface 1S1 of the semiconductor package 1 by, for example, soldering. In the semiconductor device 7 configured in this manner, the first main current circuit pattern 73 is used as a drain electrode. The first main current circuit pattern 73 is connected to the external electrode 74.

The circuit pattern 75 is connected to the exposed surface (FIG. 2) of the conductor plate 38 of the second surface 1S2 of the semiconductor package 1 by the wire 76. The circuit pattern 75 is connected to the external electrode 77. Accordingly, the external electrode 77 is electrically connected to the exposed surface of the conductor plate 38 by the wire 76. The wire 76 that electrically connects the exposed surface of the conductor plate 38 and the external electrode 77 may be, for example, a wire having a wire diameter of 400 μmΦ or more and containing aluminum as a main material, or a wire containing copper or the like as a main material. When the wire 76 is a wire containing copper as a main material, the electric conductivity can be improved.

The signal terminal 79 is connected to the exposed surface (FIG. 2) of the conductor piece 48 of the second surface 1S2 of the semiconductor package 1 by the wire 78. The wire 78 that electrically connects the exposed surface of the conductor piece 48 and the signal terminal 79 may be, for example, a wire having a wire diameter of 200 μmΦ or more and containing aluminum as a main material.

Figure 5:
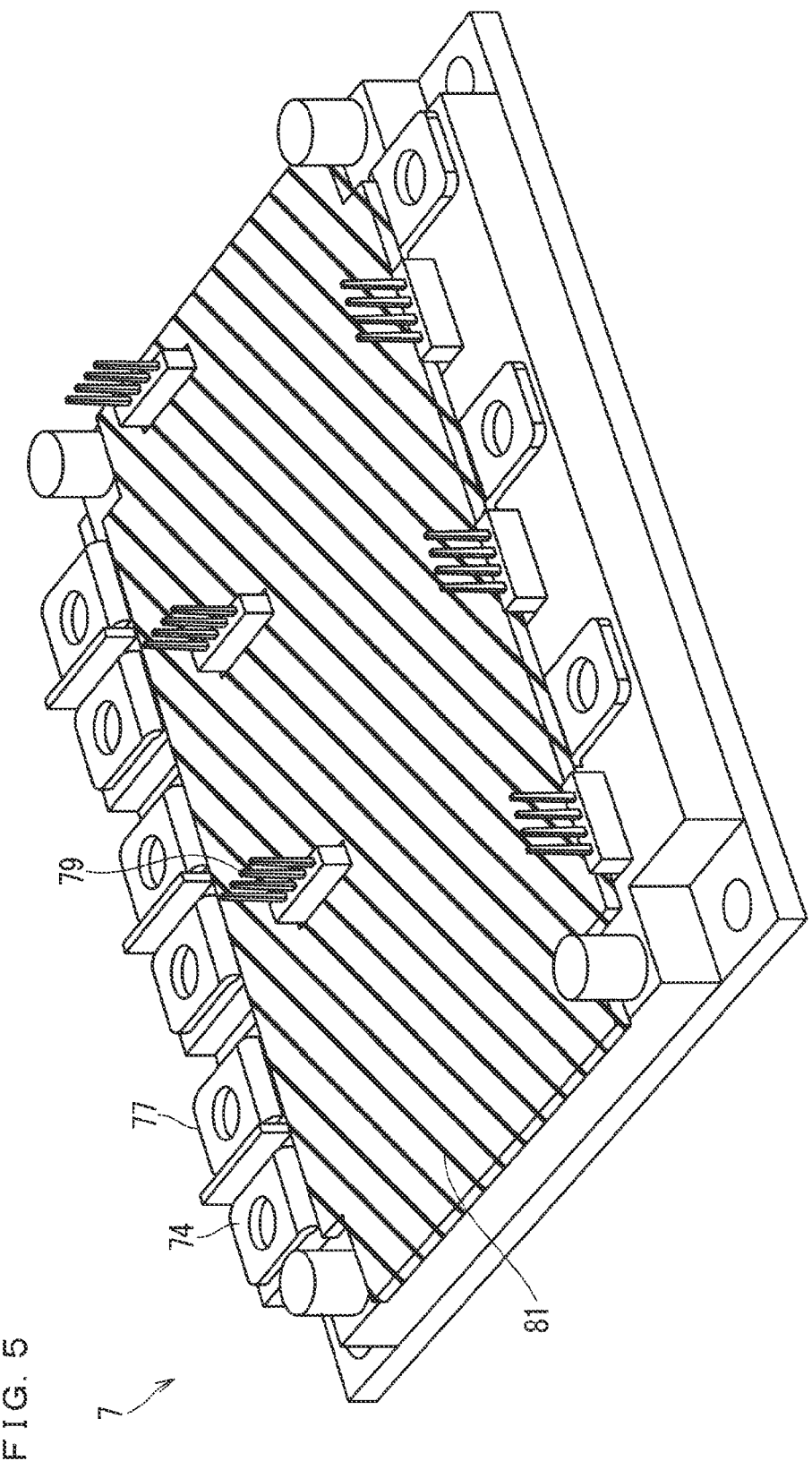
FIG. 5 A schematic perspective view illustrating the configuration of the semiconductor device according to Embodiment 1.

As described above, the semiconductor package 1 is electrically connected to the external electrode 74, the external electrode 77, and the signal terminal 79. In Embodiment 1, although the resin case 71, the external electrodes 74 and 77, and the signal terminals 79 are integrally formed, the present invention is not limited thereto. After the semiconductor package 1 is connected to the external electrode 74 and the like, as illustrated in FIG. 4, the sealing material 80 is sealed in the space of the container body, so that the periphery of the semiconductor package 1 is sealed with the sealing material 80. The sealing material 80 contains, for example, a silicone gel. After gel sealing, as illustrated in FIGS. 4 and 5, by attaching the lid 81 to the resin case 71, the outside of the semiconductor device 7 and the inside of the semiconductor device 7 including the bonding structure around the semiconductor package 1 and the semiconductor package 1 is separated.

In the example of FIG. 4, the metal layer 82 such as a conductor plate is arranged on the surface of the insulating substrate 72 opposite to the semiconductor package 1, and is connected to cooling fins (not illustrated). Common bonding materials and methods are employed, such as brazing, solder, and thermal grease to connect the metal layer 82 to the cooling fins. By cooling the cooling fins, the heat generated from the semiconductor element 3 is dissipated. It may also be adopted that, in addition to the metal layer 82, the semiconductor element 3 may be cooled by directly applying cooling water to the metal layer 82 without connecting the metal layer 82 to the cooling fins.

Summary of Embodiment 1

According to the semiconductor package 1 of Embodiment 1, signal-wiring a plurality of semiconductor elements 3 such as MOSFETs containing SiC with the wiring element 4 containing Si, for example, allows the conductor piece 48 to be dealt as a control pad (such as a gate electrode, a source Kelvin electrode, a current sense source electrode, a temperature sense element electrode), the conductor plate 38 to be dealt as a source electrode, and the conductor substrate 2 to be dealt as a drain electrode. Consequently, a plurality of semiconductor elements 3 can be dealt as if they were a single semiconductor element, and by extension, a single semiconductor chip. Therefore, for example, reduction in cost due to the improvement in the assemblability of the semiconductor device 7 in the wire bonding or die bonding process, and downsizing of the semiconductor device 7 are realized. Further, the main current circuit pattern corresponding to the source electrode is not arranged on the wiring element 4; therefore, reduction in cost due to the improvement in the assemblability of the semiconductor package 1 and downsizing of the semiconductor package 1 are realized.

Further, by providing the wiring element 4, the length of the wire 78 can be shortened as much as possible, and the diameter of the wire 78 can be made smaller. Therefore, the dimension of the control pad 34$c$ of the semiconductor element 3 can be made as small as possible. As a result, the effective area of the semiconductor element 3 can be made expanded. In particular, when an expensive material such as SiC is used as the base material of the semiconductor element 3, it is effective to reduce the product cost by expanding the effective area of the semiconductor element 3.

Further, in Embodiment 1, each of a plurality of semiconductor elements 3 includes, for example, a MOSFET (not illustrated) that performs a switching operation and a body diode (not illustrated) that performs a reflux operation. According to such a configuration, the semiconductor element such as an SBD can be omitted; therefore, the reduction in cost the semiconductor package 1 and the downsizing the same can be realized.

When there is a crystal defect in the MOSFET containing SiC and the body diode is energized, this defect may grow and the characteristics may deteriorate. However, by performing the screening test, the semiconductor package 1 having a defect is prevented from being mounted in the semiconductor device 7. This screening test requires a relatively large current to flow; therefore, there remains concerns in that, when a large current is applied to the thin front surface electrode 32$f$, the front surface electrode 32$f$ is damaged, also, that the heat generated by energization is not efficiently exhausted and is trapped in the semiconductor element 3 to raise the temperature of the semiconductor element 3 high, and further, that the current and heat are to be concentrated at a location where the test jig such as the probe pin comes into contact, for example. However, such electrode damage can be suppressed by performing the screening test after forming a plurality of conductor plates 38 and then forming the semiconductor package 1 as in Embodiment 1. Further, a material with a large heat capacity such as copper is directly bonded and electrically and thermally connected; therefore, the heat generated during the screening test can be exhausted from the semiconductor element 3 more effectively than when the semiconductor element 3 is tested alone. In addition, the test jig such as the probe pin comes into contact with the conductor plate 38 once; therefore, the current can be distributed and the current of the screening test can be uniformly applied to the semiconductor element 3. That is, for the conductor plate 38, a material such as copper having a large heat capacity and a high electric conductivity is desirably applied. Further, in the configuration in which the semiconductor package 1 is the smallest unit (1-in-1 configuration) in the circuit configuration as in Embodiment 1, the defective rate reduces more than in a case where the screening test is conducted on a semiconductor device having a larger circuit scale than the 1-in-1 configuration such as 2-in-1 configuration or 6-in-1 configuration.

In the configuration in which the wiring substrate 41 of the wiring element 4 contains Si as a main material, the wiring element 4 can be easily formed by the existing wafer process. Therefore, if the rear surface electrode being the same as or similar to the semiconductor element 3 is also formed on the wiring element 4, the wiring element 4 can be formed by the same method as the semiconductor element 3, so that the reduction in the manufacturing cost is realized.

In the configuration in which the wiring substrate 41 of the wiring element 4 contains a resin, the resin substrate to which the conductor pieces 48 are bonded in advance can be bonded to the conductor substrate 2, so that the assemblability of the semiconductor package 1 can be improved. Further, for example, when a plurality of first relay pads 42$r$ and a plurality of second relay pads 43$r$ arranged on the surface of the resin substrate contain a copper material, the wiring substrate 41 can be bonded to the conductor substrate 2 after the conductor piece 48 is bonded to the second relay pad 43$r$ by sinter-bonding. Further, for example, by selectively forming at least one of a thin film such as copper being a bonding film, a thin film such as nickel, silver and copper being a connecting film, and a thin film such as gold being an antioxidant film on the rear surface of the resin substrate, solder bondability and sinter bondability using silver or copper can be improved to improve manufacturability. Further, according to the wiring substrate 41 made of a resin substrate, the processing time for bonding the conductor pieces 48 to the second relay pads 43$r$ can be shortened more than the processing time with the wiring substrate 41 made of a silicon substrate, so that the manufacturing cost can be suppressed.

Further, in Embodiment 1, a bonding material having a melting point higher than the melting point of the solder is used as the bonding material 21 for bonding a plurality of semiconductor elements 3 and the conductor substrate 2. Consequently, when the semiconductor package 1 is solder-bonded to, for example, the first main current circuit pattern 73 on the insulating substrate 72, remelting of the bonding material 21 under the semiconductor element 3 is prevented. As a result, deterioration of yield and heat dissipation property is suppressed. Further, the deterioration of the bonding material 21 when the semiconductor element 3 is operated at a high junction temperature can be suppressed; therefore, the reliability of the semiconductor package 1 can be improved.

Further, in Embodiment 1, the sinter-bonding for bonding a plurality of semiconductor elements 3 and the conductor substrate 2 is performed using a silver-based material without pressurization. As a result, the positional deviation during pressurization can be avoided, and the dimensional tolerance can be reduced, so that the semiconductor package 1 can be downsized. In addition, the number of consumable members such as Teflon sheets used for pressure processing can be reduced to reduce the manufacturing cost. When the sinter-bonding for bonding a plurality of semiconductor elements 3 and the conductor substrate 2 is performed using a copper-based material, the intensity of bonding is higher than in the case where the sinter-bonding is performed using a gold-based material; therefore, the reliability of the semiconductor package 1 can be expected to be improved.

Further, in Embodiment 1, the end portion of the semiconductor element 3 is covered with the protective film 36. With this configuration, not only the adhesion between the semiconductor element 3 and the sealing material 6 can be improved, but also the stress buffering effect can be obtained, so that the reliability of the semiconductor package 1 can be improved. In the configuration in which the protective film 36 contains polyimide, the constituent material of the surface of the semiconductor element 3 and the sealing material 6 have high affinity to each other, so that the reliability of the semiconductor package 1 can be improved.

Further, in Embodiment 1, after bonding a plurality of semiconductor elements 3 and the wiring element 4 to the conductor substrate 2, the precursor solution of the protective film 36 is drawn using a dispenser, and the precursor solution is fired; therefore the protective film 36 is formed. As a result, melting of the bonding material 21 under the semiconductor elements 3 in the process of firing the protective film 36 is suppressed.

Further, in Embodiment 1, the conductor substrate 2 contains copper as a main material. As a result, the semiconductor package 1 can be easily solder-bonded to the circuit pattern (for example, the first main current circuit pattern 73) outside the semiconductor package 1. Further, according to such a configuration, the heat of the semiconductor element 3 can be efficiently diffused, so that the thermal resistance can be reduced. Typically, the loss worsens as the temperature of a MOSFET containing SiC rises; therefore, performing effective cooling of the MOSFET is preferable, however, enlargement of area is difficult to achieve due to the influence of the yield and there is a problem of high thermal resistance. On the other hand, in Embodiment 1, the conductor substrate 2 which is sinter-bonded directly under the semiconductor element 3 using silver contains a copper material having high thermal conductivity. Therefore, such a configuration enables to promote heat diffusion, specifically, to perform efficient heat diffusion in an area substantially equal to or larger than the area of the semiconductor element 3, so that the thermal resistance can be reduced.

Further, in Embodiment 1, the groove 2d, being a recess, is arranged in a region other than the region to which a plurality of semiconductor elements 3 and the wiring element 4 are bonded in the first main surface 2S1 of the conductor substrate 2. As a result, the adhesion between the sealing material 6 and the conductor substrate 2 improves, so that the reliability of the semiconductor package 1 can be improved. Further, the tensile stress on the surface of the conductor substrate 2 can be dispersed, the warp of the semiconductor package 1 can be suppressed.

Further, in Embodiment 1, the conductor plate 38 and the conductor piece 48 contain copper as a main material. As a result, the conductor plate 38 and the conductor piece 48 can be formed at low cost, and each of them can be easily bonded by soldering.

Further, in Embodiment 1, various bonding methods such as wire bonding and solder bonding are used for the external electrodes 74 and 77 and the signal terminal 79. As a result, the semiconductor package 1 can be easily mounted and bonded to the semiconductor device 7, and the production equipment can be shared with the conventional semiconductor device and; therefore, the manufacturing cost and investment in the production equipment of the semiconductor device 7 can be curtailed.

Embodiment 2

Figure 6:
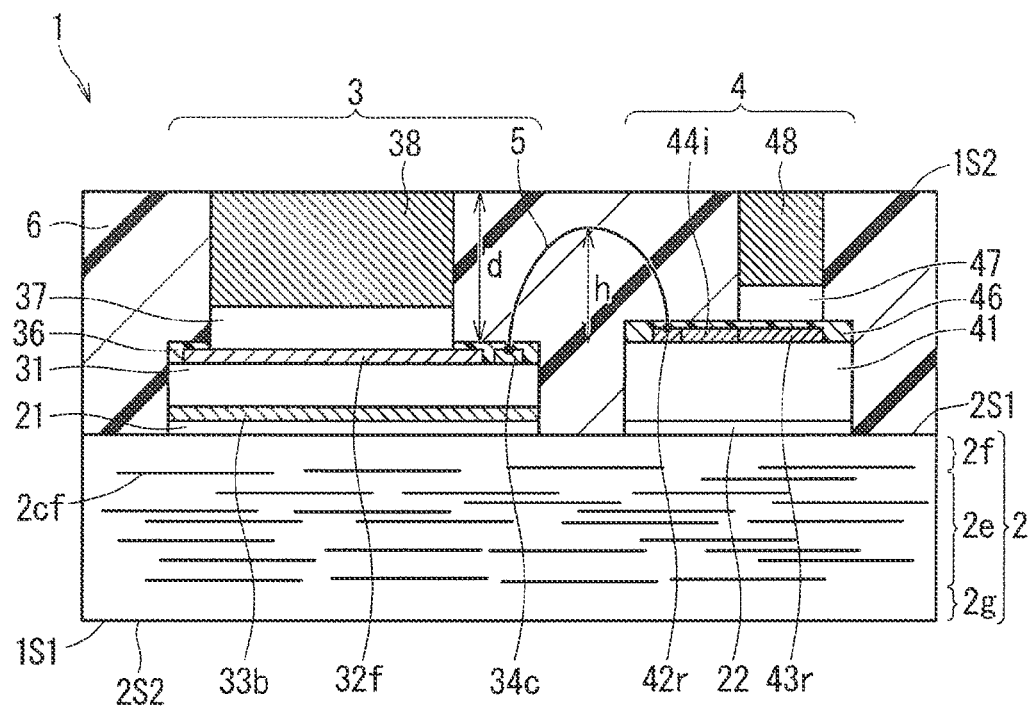
FIG. 6 A schematic cross-sectional view illustrating a configuration of a semiconductor package according to Embodiment 2.

FIG. 6 is a schematic cross-sectional view corresponding to FIG. 2, illustrating a configuration of a semiconductor package 1 according to Embodiment 2. Hereinafter, of the components according to Embodiment 2, the same or similar reference numerals are given to the same or similar components as those described above, and different components will be mainly described.

As illustrated in FIG. 6, a conductor substrate 2 of the semiconductor package 1 according to Embodiment 2 includes a laminated plate 2e containing carbon fibers 2cf. The carbon fibers 2cf are arranged along the plane direction of semiconductor substrates 31 of a plurality of semiconductor elements 3. By adjusting parameters such as the content, diameter and length of the carbon fibers 2cf, the thermal conductivity and the coefficient of linear expansion of the semiconductor element 3 in the lateral direction can be arbitrarily adjusted. The laminated plate 2e contains aluminum as a main material.

In Embodiment 2, the conductor substrate 2 includes a laminated plate material 2f containing no carbon fiber 2cf and arranged on a first main surface 2S1 side and laminated plate material 2g containing no carbon fiber 2cf and arranged on a second main surface 2s2 side. Each of the laminated plate materials 2f and 2g may include a connecting film containing, for example, nickel or copper as a main material and arranged on the outermost surface of the laminated plate 2e. Further, each of the laminated plate materials 2f and 2g may include an antioxidant film, containing, for example, gold as a main material and arranged on the outermost surface of the connecting film. The connecting film and the antioxidant film can be formed, for example, by plating. Even if the connecting film is oxidized, an oxide film can be removed relatively easily by performing a treatment such as solder bonding under a reducing atmosphere, so that an antioxidant film is not always necessary.

Summary of Embodiment 2

The conductor substrate 2 includes the laminated plate 2e containing carbon fibers 2cf therein. According to such a configuration, a warp of the semiconductor package 1 can be suppressed by adjusting the coefficient of linear expansion of the conductor substrate 2, so that the assemblability and reliability of the semiconductor package 1 can be improved.

In Embodiment 2, the carbon fibers 2cf are arranged along the plane direction of semiconductor substrates 31 of a plurality of semiconductor elements 3. As a result, the heat generated from the semiconductor element 3 can be efficiently diffused, so that efficient cooling can be performed in a range equal to or larger than the effective area of the semiconductor element 3.

Further, in the configuration in which the laminated plate 2e contains aluminum as a main material as in Embodiment 2, the Young's modulus lowers more than in the configuration in which the laminated plate 2e contains copper as a main material. By utilizing this configuration and the adjustment of the coefficient of linear expansion of the conductor substrate 2 by incorporating the carbon fibers 2cf, the stress generated in the semiconductor element 3 and the sealing material 6 can be reduced. As a result, a warp of the semiconductor package 1 can be suppressed, and the sealing material 6 can be suppressed from peeling from the conductor substrate 2, so that the assemblability and reliability of the semiconductor package 1 can be improved.

It should be noted that in a case where each of the laminated plate materials 2f and 2g is composed of a connecting film containing nickel or copper as a main material and arranged on the outermost surface of the laminated plate 2e containing aluminum, and an antioxidant film containing gold as a main material and arranged on the outermost surface of the connecting film, the solder bondability and the sinter bondability using silver can be improved to improve the manufacturability. When nickel is used for the connecting film, gold is desirably provided on the outermost surface in order to secure the bondability of the sinter-bonding using silver.

Embodiment 3

Figure 7:
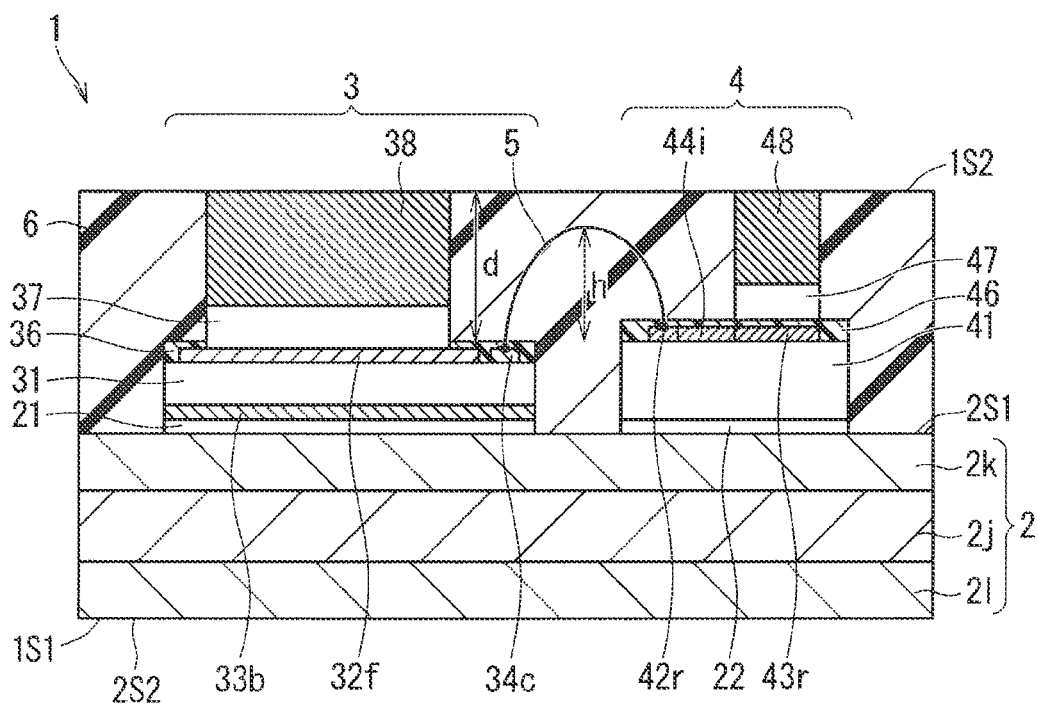
FIG. 7 A schematic cross-sectional view illustrating a configuration of a semiconductor package according to Embodiment 3.

FIG. 7 is a schematic cross-sectional view corresponding to FIG. 2, illustrating a configuration of a semiconductor package 1 according to Embodiment 3. Hereinafter, of the components according to Embodiment 3, the same or similar reference numerals are given to the same or similar components as those described above, and different components will be mainly described.

As illustrated in FIG. 7, a conductor substrate 2 of the semiconductor package 1 according to Embodiment 3 includes a laminated metal film having three or more metal films. In the example of FIG. 7, the three or more metal films are an inner layer metal film 2j being a first metal film inner in the lamination direction, and a surface layer metal film 2k and a surface layer metal film 2l being a second metal film and a third metal film, respectively, outer in the lamination direction. The surface layer metal film 2k is arranged on one surface of the inner layer metal film 2j, and the surface layer metal film 2l is arranged on the other surface of the inner layer metal film 2j. The coefficient of linear expansion of the inner layer metal film 2j is lower than the coefficient of linear expansion of the surface layer metal films 2k and 2l. The surface layer metal films 2k and 21 contain copper as a main material, and the inner layer metal film 2j contains nickel and iron as main materials. The three or more metal films are not limited to the inner layer metal film 2j and the surface layer metal films 2k and 2l.

Summary of Embodiment 3

In Embodiment 3, the coefficient of linear expansion of the conductor substrate 2 is adjustable by the inner layer metal film 2j and the surface layer metal films 2k and 21; therefore, a warp of the semiconductor package 1 can be suppressed, consequently, the assemblability and reliability of the semiconductor package 1 can be improved.

Further, in Embodiment 3, the surface layer metal film 2k contains copper as a main material, the heat generated by the semiconductor element 3 can be easily diffused. Further, the surface layer metal film 2l contains copper as a main material; therefore, solder-bonding can be easily performed. And, a warp of the semiconductor package 1 can be suppressed by interposing the inner layer metal film 2j containing nickel having a coefficient of linear expansion lower than that of copper between the surface layer metal films 2k and 21 containing copper. In addition, the bondability between copper and nickel is relatively favorable, the bondability between the inner layer metal film 2j and the surface layer metal films 2k and 21 can be secured, consequently, the manufacturability and reliability of the semiconductor package 1 can be secured while suppressing the above warp.

Embodiment 4

Figure 8:
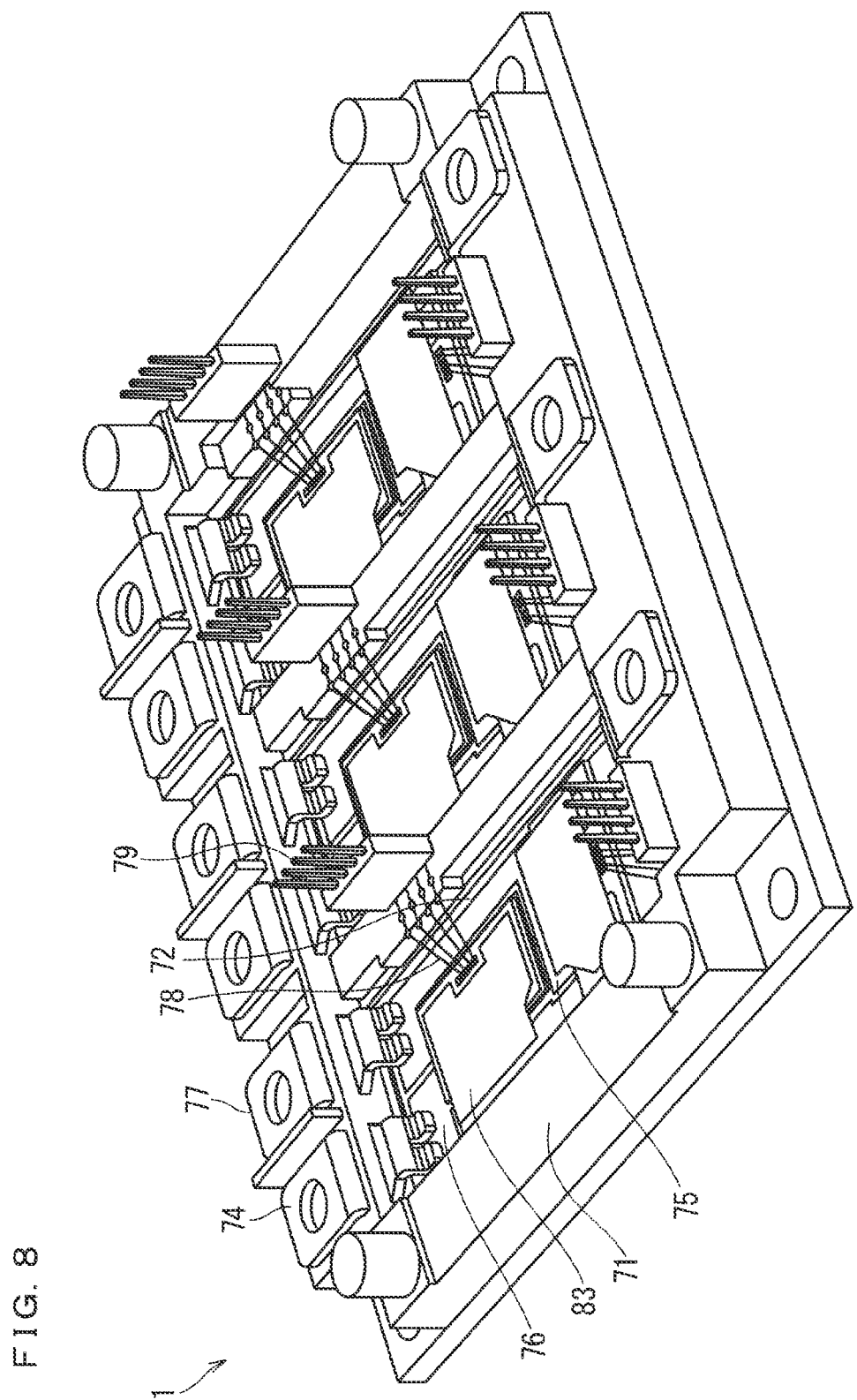
FIG. 8 A schematic perspective view illustrating a configuration of a semiconductor device according to Embodiment 4.

FIG. 8 is a perspective cross-sectional view illustrating a configuration of a semiconductor device 7 according to Embodiment 4. Hereinafter, of the components according to Embodiment 4, the same or similar reference numerals are given to the same or similar components as those described above, and different components will be mainly described.

As illustrated in FIG. 8, in the semiconductor device 7 according to Embodiment 4, a conductor frame 83 is used instead of the wire 76 in FIG. 3. Specifically, the circuit pattern 75 is connected to the exposed surfaces of conductor plates 38 of the second surface 1S2 of the semiconductor package 1 by the conductor frame 83, and is also connected to an external electrode 77. That is, the external electrode 77 is electrically connected to the exposed surfaces of the conductor plates 38 by the conductor frame 83. The conductor frame 83 and the external electrode 77 may be integrally formed. The exposed surfaces of the conductor plates 38 and the conductor frame 83 may be bonded by solder, for example, or ultrasonically bonded, for example.

Summary of Embodiment 4

In Embodiment 4, the external electrode 77 is electrically connected to the exposed surfaces of the conductor plates 38 by the conductor frame 83. As a result, the electrical resistance can be reduced more than that with the semiconductor device 7 of FIG. 3 using the wire 76, and the bonding can be easily performed. Further, the processing time can be shortened more than the processing time with wire bonding and the manufacturing cost can be suppressed.

Embodiment 5

Figure 9:
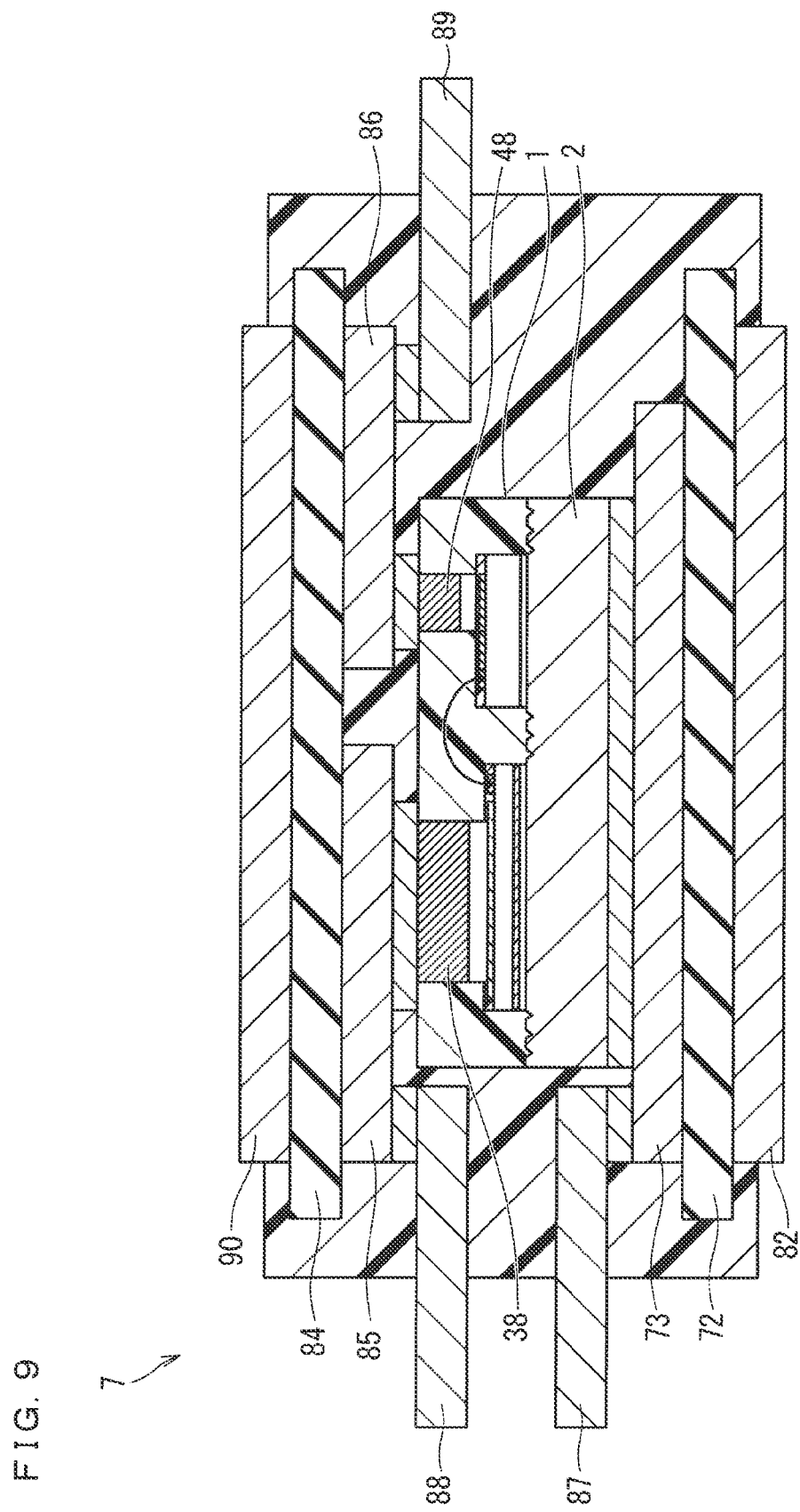
FIG. 9 A schematic cross-sectional view illustrating a configuration of a semiconductor device according to Embodiment 5.

FIG. 9 is a perspective cross-sectional view illustrating a configuration of a semiconductor device 7 according to Embodiment 5. Hereinafter, of the components according to Embodiment 5, the same or similar reference numerals are given to the same or similar components as those described above, and different components will be mainly described.

As is the same with the semiconductor device 7 illustrated in FIG. 4, the semiconductor device 7 according to Embodiment 5 illustrated in FIG. 9 includes a semiconductor package 1, an insulating substrate 72, a first main current circuit pattern 73, and a metal layer 82. Similar to Embodiment 1, the first main current circuit pattern 73 is bonded to the second main surface 2S2 of the conductor substrate 2 in the first surface 1S1 of the semiconductor package 1 by soldering, for example. The first main current circuit pattern 73 is connected to the first main electrode 87 corresponding to the external electrode 74 of FIG. 3.

Further, the semiconductor device 7 according to Embodiment 5 further includes an insulating substrate 84, a second main current circuit pattern 85 being a second circuit pattern, and a control terminal pattern 86 being a third circuit pattern. The insulating substrate 84 is arranged so as to face the exposed surface of the conductor plate 38 and the exposed surface of the conductor piece 48.

The second main current circuit pattern 85 is arranged on the insulating substrate 84, and is bonded to the exposed surface of the conductor plate 38 of the second surface 1S2 of the semiconductor package 1. The exposed surface of the conductor plate 38 and the second main current circuit pattern 85 are bonded by, for example, solder. The second main current circuit pattern 85 is connected to a second main electrode 88 corresponding to the external electrode 77 in FIG. 3.

The control terminal pattern 86 is arranged on the insulating substrate 84, and is bonded to the exposed surface of the conductor piece 48 of the second surface 1S2 of the semiconductor package 1. The exposed surface of the conductor piece 48 and the control terminal pattern 86 are bonded by, for example, solder. The control terminal pattern 86 is connected to a control terminal 89 corresponding to the signal terminal 79 in FIG. 3. As a result, the control signal from the outside of the semiconductor device 7 is input to the semiconductor element 3 in the semiconductor package 1 via the signal terminal 79 or the like.

A metal layer 82 for cooling is arranged on the surface of the insulating substrate 72 opposite to the surface on which the first main current circuit pattern 73 is arranged, and a metal layer 90 for cooling is arranged on the surface of the insulating substrate 84 opposite to the surface on which the second main current circuit pattern 85 is arranged. Then, the metal layers 82 and 90 for cooling are cooled directly or indirectly, so that the semiconductor package 1 is cooled from both sides. In a configuration in which direct cooling is performed, making parts of the metal layers 82 and 90 for cooling be watertight areas, and cooling water is directly applied to the cooling portions of the metal layers 82 and 90 to cool the metal layers 82 and 90. In a configuration in which indirect cooling is performed, the cooling metal layers 82 and 90 are connected to the cooling fins using common bonding materials and methods, such as brazing materials, solder, thermal grease or the like. By cooling the cooling fins, the heat generated from the semiconductor element 3 is dissipated.

Conclusion of Embodiment 5

In Embodiment 5, the semiconductor package 1 can be efficiently cooled by the double-sided cooling structure that cools both sides of the semiconductor device 7. Further, according to the configuration of Embodiment 5 in which the semiconductor package 1 is interposed between the two insulating substrates 72 and 84, the assembling of the semiconductor device is more easily performed than that in a case where a plurality of MOSFETs including SiC having a relatively small chip size are individually arranged in parallel to assemble.

The area of the semiconductor package 1 is larger than that of the single semiconductor element 3; therefore, the inclination accuracy can be more easily enhanced than that in a case where the semiconductor element 3 is directly mounted on the double-sided cooling structure, consequently, the thermal resistance in the double-sided cooling structure can be stabilized. Further, damage to semiconductor elements that occurs when pressurized or fixed with a jig to enhance the inclination accuracy and position accuracy can be suppressed.

It should be noted that Embodiments of the present invention can be arbitrarily combined and can be appropriately modified or omitted without departing from the scope of the invention.

While the invention has been described in detail, the forgoing description is in all aspects illustrative and not restrictive. It is understood that numerous other modifications and variations can be devised without departing from the scope of the invention.

EXPLANATION OF REFERENCE SIGNS 1 semiconductor package, 2 conductor substrate, 2cf carbon fibers, 2d groove, 2e laminated plate, 2j inner layer metal film, 2k 2l surface layer metal film, 2S1 first main surface, 2S2 second main surface, 3 semiconductor element, 4 wiring element, 5, 76, 78, wire, 6 sealing material, 7 semiconductor device, 31 semiconductor substrate, 32f front surface electrode, 33b rear surface electrode, 34 control pad, 36 protection film, 37 solder, 38 conductor plate, 41 wiring substrate, 42r first relay pad, 43r second relay pad, 44i internal wiring portion, 47 solder, 48 conductor piece, 73 first main current circuit patter, 77 external electrode, 79 signal terminal, 83 conductor frame, 84 insulating substrate, 85 second main current circuit pattern, 86 control terminal pattern.

The invention claimed is:

1. A semiconductor package comprising:
a conductor substrate;
a plurality of semiconductor elements having a switching function and bonded to a first main surface of the conductor substrate; and
a wiring element bonded to the first main surface of the conductor substrate, wherein
each of the plurality of semiconductor elements includes:
a first substrate,
a first main electrode arranged on a surface of the first substrate opposite to the conductor substrate,
a second main electrode arranged on a surface of the first substrate on a conductor substrate side and bonded to the conductor substrate, and
a control pad configured to control a current flowing between the first main electrode and the second main electrode,
the wiring element includes
a second substrate,
a plurality of first connection portions arranged on a surface of the second substrate opposite to the conductor substrate and connected to each of the control pads of the plurality of semiconductor elements, and
a plurality of second connection portions arranged on the surface of the second substrate opposite to the conductor substrate and electrically connected to the first connection portions.

2. The semiconductor package according to claim 1, further comprising:
a plurality of first conductor members bonded to the first main electrodes of the plurality of semiconductor elements;
a plurality of second conductor members bonded to the plurality of second connection portions of the wiring element; and
a sealing material covering the plurality of semiconductor elements, the wiring element, at least a part the plurality of first conductor members, at least a part of the plurality of second conductor members, and the first main surface of the conductor substrate, with a first exposed surface being a surface of the plurality of first conductor members on the opposite side of the conductor substrate exposed, with a second exposed surface being a surface of the plurality of second conductor members on the opposite side of the conductor substrate exposed, and with a second main surface of the conductor substrate on an opposite side of the first main surface being a third exposed surface.

3. The semiconductor package according to claim 1, wherein
a number of the plurality of second connection portions is equal to or less than a number of the plurality of first connection portions.

4. The semiconductor package according to claim 1, wherein
a melting point of a bonding material for bonding the plurality of semiconductor elements and the conductor substrate is higher than 450° C.

5. The semiconductor package according to claim 1, wherein
the plurality of semiconductor elements and the conductor substrate are sinter-bonded with a silver-based material or a copper-based material.

6. The semiconductor package according to claim 1, wherein
the plurality of semiconductor elements and the conductor substrate are diffusion-bonded.

7. The semiconductor package according to claim 2, further comprising
a protection film covering end portions of the plurality of semiconductor elements and having a Young's modulus lower than that of the sealing material.

8. The semiconductor package according to claim 7, wherein
the protective film contains polyimide.

9. The semiconductor package according to claim 1, wherein
a recess is arranged in a region in the first main surface of the conductor substrate other than a region to which the plurality of semiconductor elements and the wiring element are bonded in the first main surface of the conductor substrate.

10. The semiconductor package according to claim 2, wherein
the plurality of first conductor members and the first main electrodes of the plurality of semiconductor elements are bonded by a solder.

11. The semiconductor package according to claim 1, wherein
the plurality of semiconductor elements include compound semiconductors.

12. The semiconductor package according to claim 11, wherein
the plurality of semiconductor elements contain silicon carbide as a largest material part for the compound semiconductors.

13. The semiconductor package according to claim 1, wherein
the second substrate of the wiring element contains silicon as a largest material part.

14. The semiconductor package according to claim 1, wherein
the second substrate of the wiring element contains a resin.

15. The semiconductor package according to claim 1, wherein
the semiconductor elements are thinner than the wiring element.

16. The semiconductor package according to claim 1, wherein
each of the plurality of semiconductor elements includes a MOSFET configured to perform a switching operation and a body diode configured to perform a reflux operation, and
bidirectional energization between the MOSFET and the body diode is executable.

17. A semiconductor device comprising
at least one semiconductor package according to claim 1.

18. The semiconductor device according to claim 17, wherein
the at least one semiconductor package includes six semiconductor packages constituting a full bridge circuit.

19. A semiconductor device comprising:
at least one semiconductor package according to claim 2; and
a first circuit pattern bonded, by solder, to the third exposed surface.

20. The semiconductor device according to claim 19, wherein
the first circuit pattern is used as a drain electrode.

21. A semiconductor device comprising:
at least one semiconductor package according to claim 2; and
a control terminal connected, by a wire, to the second exposed surface of each of the second conductor members.

22. A semiconductor device comprising:
at least one semiconductor package according to claim 2; and
a main terminal electrically connected, by a wire, to the first exposed surface of each of the first conductor members.

23. The semiconductor device according to claim 22, wherein
the wire electrically connecting the first exposed surface of each of the first conductor members and the main terminal contains copper as a largest material part.

24. A semiconductor device comprising:
at least one semiconductor package according to claim 2; and
a main terminal electrically connected, by a conductor frame, to the first exposed surface of each of the first conductor members.

25. The semiconductor device according to claim 24, wherein
the first exposed surface of each of the first conductor members and the conductor frame are bonded to each other by solder.

26. The semiconductor device according to claim 24, wherein
the first exposed surface of each of the first conductor members and the conductor frame are ultrasonically bonded to each other.

27. A semiconductor device comprising:
at least one semiconductor package according to claim 2;
an insulating substrate arranged to face the first exposed surfaces of the first conductor members and the second exposed surfaces of the second conductor members;
a second circuit pattern arranged on the insulating substrate and bonded to the first exposed surfaces of the first conductor members; and
a third circuit pattern arranged on the insulating substrate and bonded to the second exposed surfaces of the second conductor members.

28. The semiconductor device according to claim 27, wherein
the first exposed surface of each of the first conductor members and the second circuit pattern are bonded to each other by a solder; and the second exposed surface of each of the second conductor members and the third circuit pattern are bonded to each other by a solder.

* * * * *